United States Patent [19]
Hahn et al.

[11] Patent Number: 5,700,976
[45] Date of Patent: Dec. 23, 1997

[54] ELECTRONIC DEVICE HOUSING

[75] Inventors: Karl-Heinz Hahn, Eggenstein-Leopoldshafen; Chartchai Saisila, Ruelzheim, both of Germany

[73] Assignee: Siemens Aktiengesellschaft, Munich, Germany

[21] Appl. No.: 591,618

[22] PCT Filed: Aug. 8, 1994

[86] PCT No.: PCT/DE94/00915

§ 371 Date: Feb. 9, 1996

§ 102(e) Date: Feb. 9, 1996

[87] PCT Pub. No.: WO95/05062

PCT Pub. Date: Feb. 16, 1995

[30] Foreign Application Priority Data

Aug. 11, 1993 [DE] Germany ............ 94 12 000 U

[51] Int. Cl.$^6$ .................................................. H01R 13/502
[52] U.S. Cl. ........................................ 174/58; 220/3.5
[58] Field of Search ............................ 174/50, 66, 58, 174/17 CT, 48; 220/3.5, 3.8, 241

[56] References Cited

U.S. PATENT DOCUMENTS

| | | | |
|---|---|---|---|
| 1,662,422 | 3/1928 | Hodges | 220/3.6 X |
| 1,933,358 | 10/1933 | Almcrantz | 247/19 |
| 2,585,887 | 2/1952 | Woodward | 220/3.5 X |
| 2,934,590 | 4/1960 | Thompson et al. | 174/66 X |
| 3,168,612 | 2/1965 | Sorenson | 174/58 X |
| 3,248,078 | 4/1966 | Ast | 248/27 |
| 3,378,160 | 4/1968 | Bassani | 220/3.6 |
| 3,749,873 | 7/1973 | Harper et al. | 220/3.6 X |
| 3,793,563 | 2/1974 | Brefka | 220/3.8 X |
| 4,092,698 | 5/1978 | Brefka | 361/399 |
| 4,541,538 | 9/1985 | Swetnam | 220/3.8 |
| 4,569,458 | 2/1986 | Horsley | 220/3.6 |

FOREIGN PATENT DOCUMENTS

| | | | |
|---|---|---|---|
| 0 575 214 A1 | 12/1993 | European Pat. Off. . | |
| 2 365 273 | 4/1978 | France . | |
| 901913 | 1/1954 | Germany | 174/50 X |
| 534100 | 12/1955 | Germany | 174/50 X |
| 92 13 496 U | 12/1992 | Germany . | |
| 4230236 | 3/1994 | Germany | 174/17 CT X |
| 6188577 | 7/1994 | Japan | 174/50 X |
| 215699 | 10/1941 | Switzerland . | |
| 326717 | 12/1957 | Switzerland | 174/66 X |

*Primary Examiner*—Kristine L. Kincaid
*Assistant Examiner*—Dean A. Reichard
*Attorney, Agent, or Firm*—Kenyon & Kenyon

[57] ABSTRACT

An electronic device having a housing which includes a housing front part, a cup-type housing rear member and attachment elements. The housing is designed so as to allow the electronic device to be optionally operated as a hand-held unit or as a stationary-mounted unit in a cabinet door or in a control panel. The electronic device can be configured for use in either configuration without special tools or additional parts. The electronic device housing is suited for use with control panels.

7 Claims, 1 Drawing Sheet

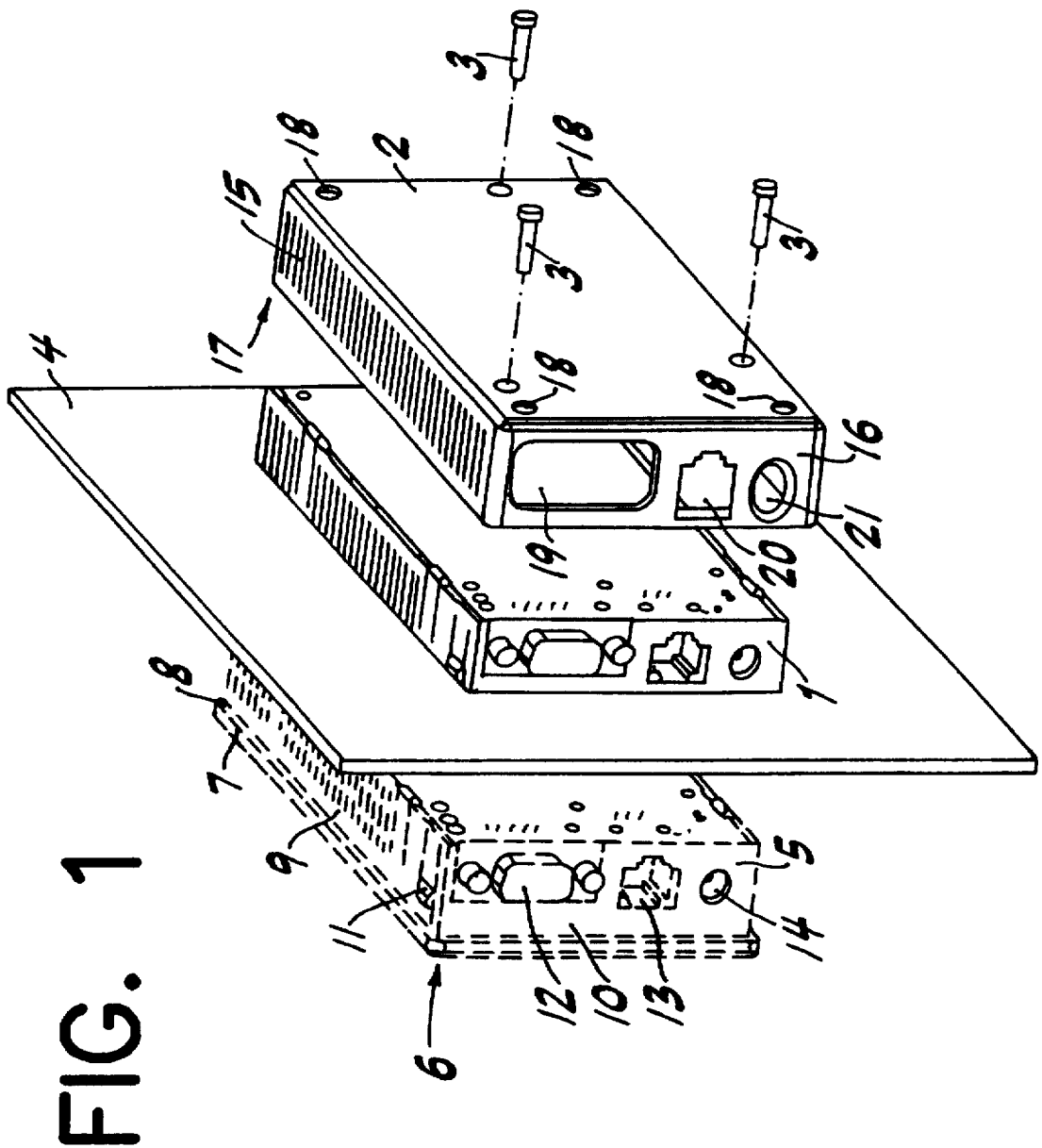

5,700,976

ELECTRONIC DEVICE HOUSING

FIELD OF THE INVENTION

The present invention relates to an electronic device having an essentially two-part housing which can be used as a hand-held unit.

BACKGROUND INFORMATION

In automation engineering, particularly in numerical control systems, external control panels, which are often used for inputting control commands, are typically connected to the control system by a flexible cable. This is advantageous when a programmer has to move around often, e.g., in order to observe travel positions when working with a robot, or when the configuration of a control system is ergonomically unfavorable or not readily accessible because of space reasons. However, the disadvantages entailed by the portability of such a control panel are, first of all, that it can easily fall on the floor and become damaged and, secondly, that it is necessary to place it on a stationary support surface or to hold it fast with one hand for operator control. In many cases, therefore, it would be preferable to have a stationary-mounted control panel instead of the portable control panel.

SUMMARY OF THE INVENTION

An object of the present invention is to provide an electronic device with a housing which can be operated both as a portable, as well as a stationary-mounted device and which can be easily converted from one method of operation to the other.

The present invention provides an electronic device with a housing comprising a front housing part including a front surface, side walls and a rim, the rim adjoining the front surface of the front housing part and extending out from the side walls of the front housing part; and a cup-like rear housing member including side walls, the rear housing member being adapted to mate with the front housing part so that upon assembly, the side walls of the rear housing member surround the side walls of the front housing part, the rear housing member further including at least one attachment element for securing the rear housing member to the front housing part so that the electronic device housing of the present invention can be assembled as a hand-held unit, wherein front edges of the side walls of the rear housing member abut a rear surface of the rim of the front housing part upon assembly of the front housing part and the rear housing member, and so that the electronic device housing of the present invention can also be installed in a suitable opening of a plate, wherein the plate is captured between the front edges of the side walls of the rear housing member and the rear surface of the rim of the front housing part upon assembly of the front housing part and the rear housing member.

The present invention has the advantage that when installing an electronic device that had previously been operated as a hand-held unit, no additional parts are needed nor are any parts left over. This rules out the inconvenience entailed in losing any such parts during long-term use under the same method of operation. A circumferential seal on the rear side of the rim on the front part of the housing advantageously prevents the ingress of dust or moisture into the electronic device. Operator-control and display elements can be accommodated quite visibly and favorably in terms of ergonomics on the front side of the front part of the housing. To secure the rear wall of the housing to the front part of the housing, standard commercial screws can be used, which can be manipulated without a special tool.

BRIEF DESCRIPTION OF THE DRAWINGS

FIG. 1 shows an exploded, perspective view of an embodiment of an electronic device in accordance with the present invention.

DETAILED DESCRIPTION

In an exploded view, FIG. 1 shows a front part of a housing 1, a rear housing member 2, attachment elements 3, and a plate 4. Since the front part 1 of the housing of the electronic device is partly hidden by the plate 4, a second housing front part 5 is depicted next to it with dashed lines, in order to make all elements visible. The two housing front parts 1 and 5 are identical and there is actually only one in an electronic device. Operator-control or display elements can be configured on one front side 6 of the housing front part 5. These are accessible both when working with an electronic device as a hand-held unit, as well as in its installed state. Adjoining the front side 6, the housing front part 5 has a circumferential rim 7, whose rear side is fitted with a seal 8. The circumferential rim 7 juts out past rear side walls 9 and 10, as well as past two other side walls that are hidden in the drawing. Provided on the side wall 9 and the opposite side wall of the housing front part 5 that is not visible is a snap-in locking element 11 which projects out laterally from the plane of the side wall and is flexibly suspended. Points of connection 12, 13 and 14 for external lines of the electronic device are provided on the side wall 10. The rear member 2 of the housing is so designed in a cup shape that it can be slid with its side walls, of which merely the side walls 15 and 16 are visible in FIG. 1 over the side walls of the housing front part 1. To assemble the electronic device as a hand-held unit, the rear member 2 of the housing is simply slid over the side members of the front part 5 of the housing, so that the front edge 17 of the side members of the rear member 2 of the housing comes to rest on the rim 7 of the front part 5 of the housing. The rear member 2 of the housing and the front part 5 of the housing can be secured to one another by inserting and tightening the screws 3. The housing rear member 2, which is now used as a base plate, is provided with rubber feet 18 to better support it on a table surface. To convert a hand-held unit into a built-in flush-mounted unit, the screws 3 are loosened, the housing rear member 2 is removed, the housing front part 5 is inserted into a suitable cut-out of a plate 4, the housing front part 5 is held together with the plate 4 by means of the snap-in locking elements 11, the housing rear member 2 is mounted on again and secured with the screws 3. When the thickness of the plate 4 and the clearance between the snap-in locking element 11 and the seal 8 conform, this snap-in locking element locks into place advantageously. Thus, the electronic device of the present invention can be easily integrated in a control panel or a cabinet door. Cut-outs 19, 20 and 21 are so designed in the housing rear member 2 that external lines can be run to the points of connection 12, 13 and 14 both in the installed state as well as in the hand-held version of the electronic device.

What is claimed is:

1. An electronic device housing, comprising:
   a front housing part including a front surface, side members and a rim, the rim adjoining the front surface of the front housing part and laterally extending out from the side members of the front housing part; and
   a cup-type rear housing member including side members, the rear housing member being adapted to mate with the front housing part so that upon assembly, the side members of the rear housing member surround the side members of the front housing part, the rear housing member further including at least one attachment element for securing the rear housing member to the front housing part so that:

the electronic device housing can be assembled as a hand-held unit, wherein front edges of the side members of the rear housing member abut a rear surface of the rim of the front housing part upon assembly of the front housing part and the rear housing member, and the electronic device housing can be installed in a suitable opening of a plate, wherein the plate is captured between the front edges of the side members of the rear housing member and the rear surface of the rim of the front housing part upon assembly of the front housing part and the rear housing member.

2. The electronic device housing of claim 1, wherein the front housing part includes a circumferential seal arranged on the rear surface of the rim.

3. The electronic device housing of claim 1, wherein the front housing part includes spring elements arranged on the side members of the front housing part, the spring elements being biased to protrude laterally from the side members of the front housing part.

4. The electronic device housing of claim 3, wherein the spring elements provide a snap-in connection, so that when the electronic device housing is installed in the opening of the plate, the spring elements grip the plate.

5. The electronic device housing of claim 1, wherein the front housing part includes points of connection for external connections arranged on at least one of the side members of the front housing part, and the rear housing member includes openings corresponding to the points of connection in the front housing part.

6. The electronic device housing of claim 5, wherein the rear housing member is designed as a base plate.

7. The electronic device housing of claim 1, wherein the front housing part houses a control panel of a programmable controller.

* * * * *

UNITED STATES PATENT AND TRADEMARK OFFICE
CERTIFICATE OF CORRECTION

PATENT NO. : 5,700,976
DATED : December 23, 1997
INVENTOR(S) : Karl-Heinz Hahn et al It is certified that error appears in the above-indentified patent and that said Letters Patent is hereby corrected as shown below:

On the title page: Item
[30] Foreign Application Priority Data,
"Aug. 11, 1993 [DE] Germany ..... 94 12 0004" should read
-- Aug. 11, 1993 [DE] Germany ..... 93 12 000.1--.

Signed and Sealed this

Eighteenth Day of August, 1998

Attest:

BRUCE LEHMAN

Attesting Officer        Commissioner of Patents and Trademarks